(12) United States Patent
Suzuki

(10) Patent No.: US 11,631,367 B2
(45) Date of Patent: Apr. 18, 2023

(54) DISPLAY DEVICE

(71) Applicant: KYOCERA Corporation, Kyoto (JP)

(72) Inventor: Takanobu Suzuki, Itami (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/598,732

(22) PCT Filed: Feb. 3, 2020

(86) PCT No.: PCT/JP2020/003874
§ 371 (c)(1),
(2) Date: Sep. 27, 2021

(87) PCT Pub. No.: WO2020/202766
PCT Pub. Date: Oct. 8, 2020

(65) Prior Publication Data
US 2022/0157230 A1 May 19, 2022

(30) Foreign Application Priority Data

Mar. 29, 2019 (JP) .............................. JP2019-065770

(51) Int. Cl.
*G09G 3/32* (2016.01)

(52) U.S. Cl.
CPC ....... *G09G 3/32* (2013.01); *G09G 2300/0452* (2013.01); *G09G 2310/08* (2013.01); *G09G 2320/0233* (2013.01)

(58) Field of Classification Search
CPC ............. G09G 2300/0452; G09G 3/32; G09G 2320/0233; G09G 2310/08
See application file for complete search history.

(56) References Cited

U.S. PATENT DOCUMENTS

| 2006/0114199 A1 | 6/2006 | Kim |
| 2010/0188436 A1 | 7/2010 | Chang et al. |
| 2011/0080434 A1 | 4/2011 | Tagawa et al. |
| 2015/0279278 A1* | 10/2015 | Park ..................... G09G 3/3233 345/212 |
| 2018/0182279 A1 | 6/2018 | Sakariya et al. |
| 2018/0190747 A1 | 7/2018 | Son et al. |

(Continued)

FOREIGN PATENT DOCUMENTS

| JP | 2006-507531 A | 3/2006 |
| JP | 2007-203602 A | 8/2007 |

(Continued)

*Primary Examiner* — Muhammad N Edun
(74) *Attorney, Agent, or Firm* — Procopio Cory Hargreaves and Savitch LLP

(57) ABSTRACT

A display device includes a first pixel unit located on a substrate and including a first micro-LED, a second pixel unit located on the substrate and including a second micro-LED having a differently colored emission and a different level of luminous efficiency from the first micro-LED, and an emission controller that controls light intensities of the first micro-LED and the second micro-LED. The first pixel unit includes a first current control switch and a first period control switch. The second pixel unit includes a second current control switch and a second period control switch. The first current control switch, the first period control switch, the second current control switch, and the second period control switch are connected to the emission controller.

8 Claims, 7 Drawing Sheets

(56) References Cited

U.S. PATENT DOCUMENTS

| | | | |
|---|---|---|---|
| 2019/0006335 A1 | 1/2019 | Lee et al. | |
| 2019/0279563 A1* | 9/2019 | Hwang | G09G 3/3225 |
| 2019/0340979 A1* | 11/2019 | Yang | G09G 3/3258 |

FOREIGN PATENT DOCUMENTS

| | | |
|---|---|---|
| JP | 2011-81043 A | 4/2011 |
| JP | 2012022181 A | 2/2012 |
| JP | 2018-519539 A | 7/2018 |
| JP | 2019-28284 A | 2/2019 |
| WO | 2004/049289 A1 | 6/2004 |
| WO | 2016/196390 A1 | 12/2016 |

* cited by examiner

DISPLAY DEVICE

FIELD

The present disclosure relates to a display device including micro-light-emitting diodes (LEDs) in pixel units.

BACKGROUND

An example of known backlight-free, self-luminous display devices including micro-LEDs is described in, for example, Patent Literature 1.

CITATION LIST

Patent Literature

Patent Literature 1: Japanese Unexamined Patent Application Publication (Translation of PCT Application) No. 2006-507531

BRIEF SUMMARY

A display device according to an aspect of the present disclosure includes a first pixel unit located on a substrate, the first pixel unit including a first micro-light-emitting diode (micro-LED), a first current control switch configured to control a drive current to be supplied to the first micro-LED, and a first period control switch configured to control an emission period of the first micro-LED. The display device includes a second pixel unit located on the substrate, the second pixel unit including a second micro-LED having a differently colored emission and a different level of luminous efficiency from the first micro-LED, a second current control switch configured to control a drive current to be supplied to the second micro-LED, and a second period control switch configured to control an emission period of the second micro-LED. And the display device includes an emission controller that controls light intensities of the first micro-LED and the second micro-LED. The first current control switch, the first period control switch, the second current control switch, and the second period control switch are connected to the emission controller.

A display device according to another aspect of the present disclosure includes a first pixel unit located on a substrate, the first pixel unit including a first micro-LED configured to emit red light, a first current control switch configured to control a drive current to be supplied to the first micro-LED, and a first period control switch configured to control an emission period of the first micro-LED. The display device includes a second pixel unit located on the substrate, the second pixel unit including a second micro-LED configured to emit green light, a second current control switch configured to control a drive current to be supplied to the second micro-LED, and a second period control switch configured to control an emission period of the second micro-LED. The display device includes a third pixel unit located on the substrate, the third pixel unit including a third micro-LED configured to emit blue light, a third current control switch configured to control a drive current to be supplied to the third micro-LED, and a third period control switch configured to control an emission period of the third micro-LED. And the display device includes an emission controller that controls light intensities of the first micro-LED, the second micro-LED, and the third micro-LED. The first current control switch, the first period control switch, the second current control switch, the second period control switch, the third current control switch, and the third period control switch are connected to the emission controller.

BRIEF DESCRIPTION OF DRAWINGS

The objects, features, and advantages of the present disclosure will become more apparent from the following detailed description and the drawings.

DETAILED DESCRIPTION

A display device according to one or more embodiments of the present disclosure will now be described with reference to the drawings. Each figure referred to below shows main components and other elements of the display device according to the embodiments. The display device according to the embodiments may thus include known components not shown in the figures, such as circuit boards, wiring, control integrated circuits (ICs), large-scale integration (LSI) circuits, and housings.

Figure 7:
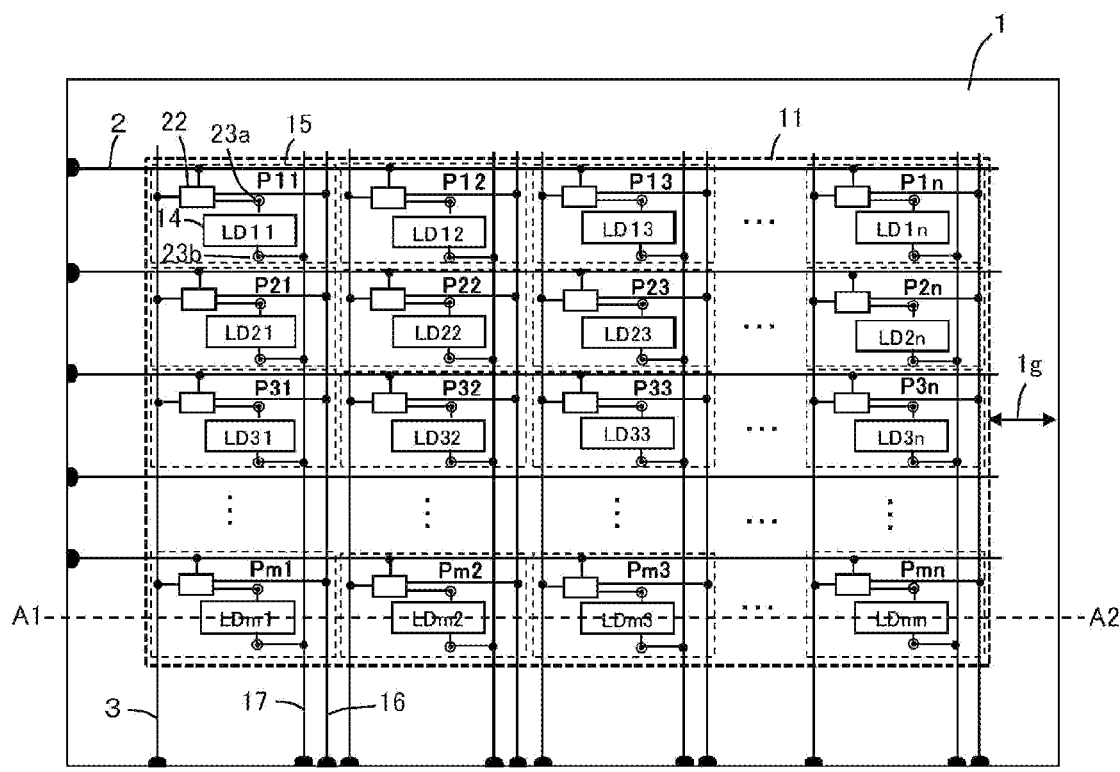
FIG. 7 is a block circuit diagram of a display device with the structure that forms the basis of the display device according to one or more embodiments of the present disclosure.

A display device with the structure that forms the basis of a display device according to one or more embodiments of the present disclosure will be described first with reference to FIGS. 7 to 9.

Figure 8A:
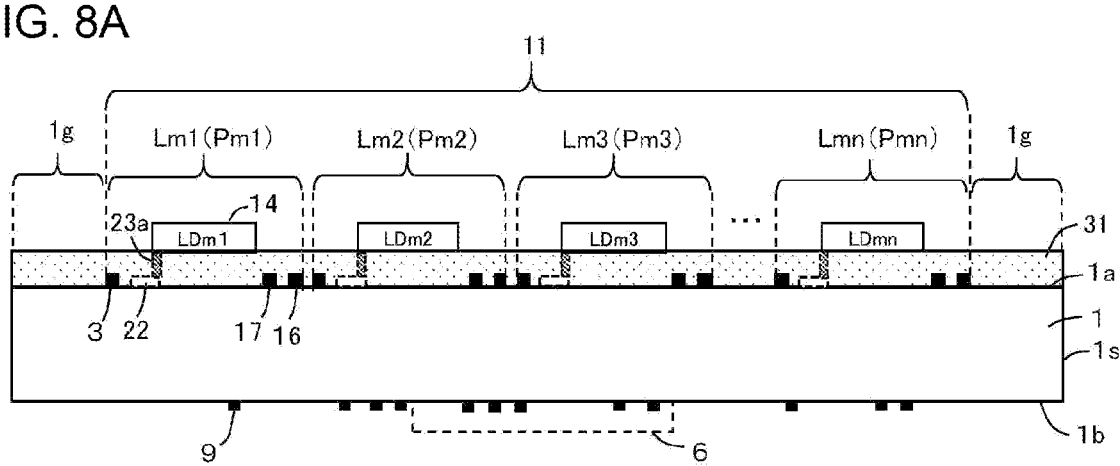
FIG. 8A is a cross-sectional view taken along line A1-A2 in FIG. 7.

A known backlight-free, self-luminous display device with the structure that forms the basis of the display device according to one or more embodiments of the present disclosure includes micro-light-emitting diodes (LEDs). FIG. 7 is a block circuit diagram of the basic structure of such a display device. FIG. 8A is a cross-sectional view taken along line A1-A2 in FIG. 7. The display device includes a substrate 1 such as a glass substrate, scanning signal lines 2 extending in a predetermined direction (e.g., a row direction) on the substrate 1, emission control signal lines 3 crossing the scanning signal lines 2 and extending in a direction (e.g., a column direction) crossing the predetermined direction, an active area (pixel area) 11 including multiple pixel units (Pmn) 15 defined by the scanning signal lines 2 and the emission control signal lines 3, and multiple micro-LEDs 14 located on an insulating layer. The scanning signal lines 2 and the emission control signal lines 3 are connected to back wiring 9 on the back surface of the substrate 1 with side wiring 30 (shown in FIG. 8B) on a side surface 1s (shown in FIGS. 8A and 8B) of the substrate 1. The back wiring 9 is connected to a driver 6 including driving elements such as ICs and LSI circuits mounted on the back surface of the substrate 1. In other words, the display in the display device is driven and controlled by the driver 6 on the back surface of the substrate 1. The driving elements as the driver 6 are mounted on the back surface of the substrate 1 by, for example, chip on glass (COG).

Each pixel unit (Pmn) 15 includes an element controller 22 to control, for example, the emission or non-emission state and the light intensity of the micro-LED (LDmn) 14 in an emissive area (Lmn). The element controller 22 includes a thin-film transistor (TFT) 12 (shown in FIG. 8B) as a switch for inputting a drive signal into the micro-LED 14 and a TFT 13 (shown in FIG. 8B) as a driving element for driving the micro-LED 14 with a current using an electric potential difference (drive signal) between a positive voltage (anode voltage of about 3 to 5 V) and a negative voltage (cathode voltage of about −3 to 0 V) corresponding to the level (voltage) of an emission control signal (signal transmitted through the emission control signal lines 3). A connection line connecting a gate electrode and a source electrode of the TFT 13 receives a capacitor, which retains the voltage of the emission control signal input into the gate electrode of the TFT 13 until the subsequent rewriting is performed (for a period of one frame).

The micro-LED 14 is electrically connected to the element controller 22, a positive voltage input line 16, and a negative voltage input line 17 with feedthrough conductors 23a and 23b such as through-holes formed through an insulating layer 31 (shown in FIG. 8A) located in an active area 11. In other words, the micro-LED 14 has a positive electrode connected to the positive voltage input line 16 with the feedthrough conductor 23a and the micro-LED element controller 22, and has a negative electrode connected to the negative voltage input line 17 with the feedthrough conductor 23b.

The display device also includes a frame 1g between the active area 11 and the edge of the substrate 1 as viewed in plan. The frame 1g, which does not contribute to display, may receive an emission control signal line drive circuit, a scanning signal line drive circuit, and other components. The width of the frame 1g is to be minimized.

Figure 9:
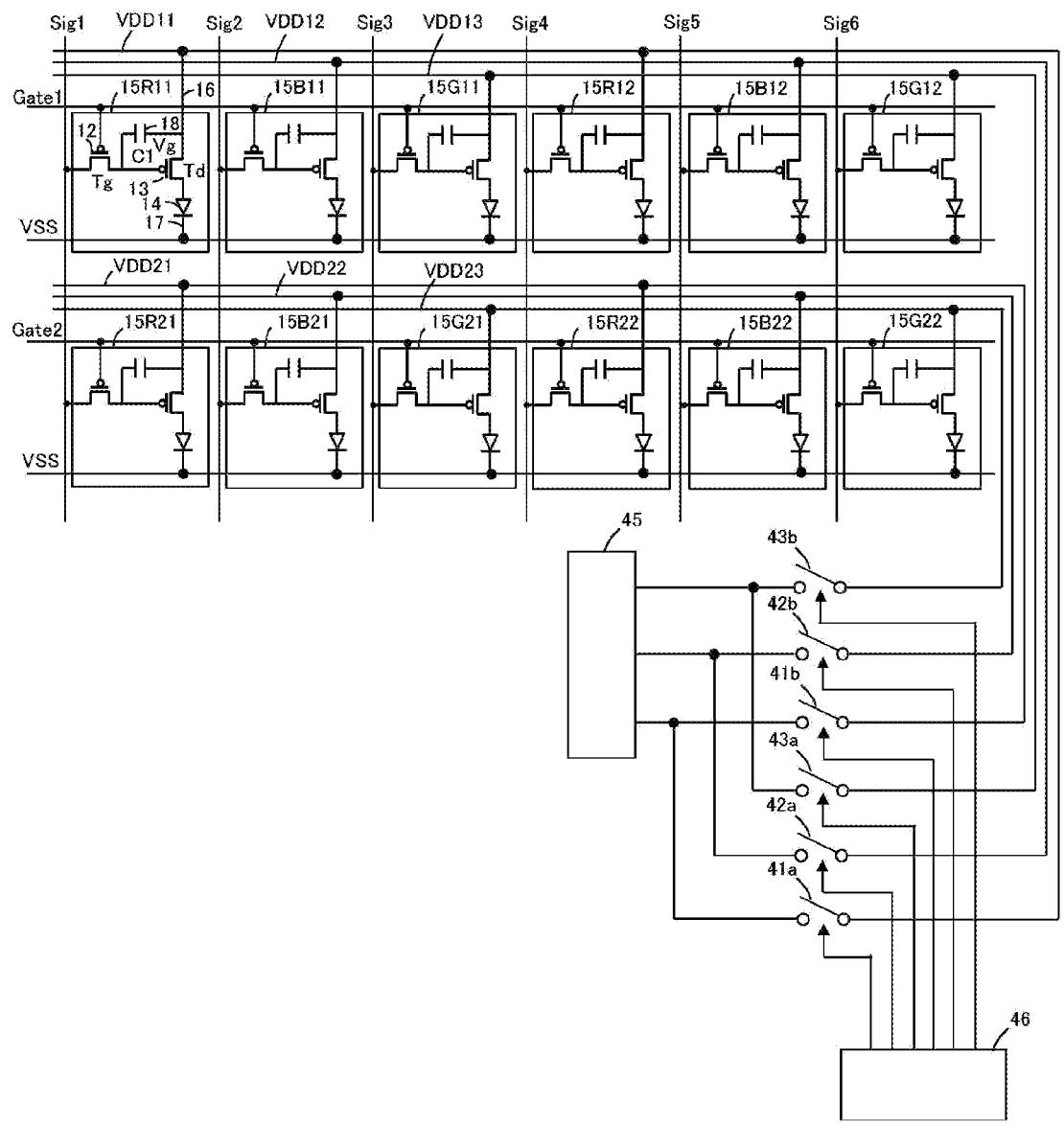
FIG. 9 is a circuit diagram of multiple pixel units including three pixel units respectively including a red micro-LED, a green micro-LED, and a blue micro-LED in a display device with the structure that forms the basis of the display device according to one or more embodiments of the present disclosure.

FIG. 9 is a circuit diagram of a display device with the structure that forms the basis of the display according to one or more embodiments of the present disclosure. The display device includes pixel units (15R11, 15B11, 15G11, 15R12, 15B12, 15G12, 15R21, 15B21, 15G21, 15R22, 15B22, and 15G22) each including a drive transistor (p-channel TFT 13) to be driven with a current, and an electroluminescence display element (micro-LED 14). Each drive transistor is connected to the corresponding display element in series between a common electric potential line (VSS) and the corresponding power line (VDD11, VDD12, VDD13, VDD21, VDD22, or VDD23) through which a controllable current is supplied to the display element. Each row of pixel units includes differently colored pixel units (15R11, 15B11, 15G11, 15R12, 15B12, 15G12, 15R21, 15B21, 15G21, 15R22, 15B22, and 15G22) to produce light outputs of different colors. The differently colored pixel units in each row (15R11, 15B11, 15G11, 15R12, 15B12, and 15G12 in the first row; 15R21, 15B21, 15G21, 15R22, 15B22, and 15G22 in the second row) correspond to the respective power lines (VDD11, VDD12, and VDD13 in the first row; VDD21, VDD22, and VDD23 in the second row). A power supply 45 can be used to switch each power line (VDD11, VDD12, VDD13, VDD21, VDD22, or VDD23) to independently control the duty cycle of the corresponding pixel unit (15R11, 15B11, 15G11, 15R12, 15B12, 15G12, 15R21, 15B21, 15G21, 15R22, 15B22, or 15G22).

The power lines (VDD11, VDD12, VDD13, VDD21, VDD22, and VDD23) receive the switches 41a, 41b, 42a, 42b, 43a, and 43b to independently control the duty cycles of the pixel units (15R11, 15B11, 15G11, 15R12, 15B12, 15G12, 15R21, 15B21, 15G21, 15R22, 15B22, and 15G22). The switch 41a on the power line VDD11 controls the pixel units 15R11 and 15R12. The switch 42a on the power line VDD12 controls the pixel units 15B11 and 15B12. The switch 43a on the power line VDD13 controls the pixel units 15G11 and 15G12. The switch 41b on the power line VDD21 controls the pixel units 15R21 and 15R22. The switch 42b on the power line VDD22 controls the pixel units 15B21 and 15B22. The switch 43b on the power line VDD23 controls the pixel units 15G21 and 15G22. A control circuit 46 controls the opening or closing of the switches 41a, 41b, 42a, 42b, 43a, and 43b.

The structure in FIG. 9 includes the switches 41a to 43b that independently control the duty cycles of the pixel units (15R11 to 15G22) located at the periphery of the active area (pixel area). This structure can easily upsize the display device. The switches corresponding to a large number of pixel units use a large area. This structure can easily upsize the display device further. To avoid such upsizing of the display device, the emissive micro-LEDs with the same color in the same row, for example, the micro-LED 14 in the pixel unit 15R11 and the micro-LED 14 in the pixel unit 15R12, can be controlled by a single switch, or for example, the switch 41a as shown in FIG. 9. This structure can reduce the number of switches, but cannot independently control the duty cycles of the pixel units 15R11 and 15R12. In addition, this structure uses a larger number of power lines (VDD11 to VDD23), possibly complicating wiring and increasing the cost of the display device.

The pixel unit 15R11 includes a p-channel TFT (Tg) 12 as a switch. In response to an on-signal (low-level signal of −3 to 0 V) transmitted through a scanning signal line (Gate1) and input into the gate electrode of the p-channel TFT 12, the p-channel TFT 12 has its channel becoming conductive to enter an on-state. This allows an emission control signal (low-level signal, Vg) transmitted through the emission control signal line (Sig1) to be input into the gate electrode of the p-channel TFT (Td) 13, which serves as a driving element. The p-channel TFT 13 having its channel becoming conductive to enter the on-state inputs a drive signal (VDD of about 3 to 5 V) to the micro-LED 14 through the positive voltage input line 16, and thus the micro-LED 14 emits light. The light intensity (luminance) of the micro-LED 14 is then controllable by the level (voltage) of the emission control signal (Vg). The connection line connecting the gate electrode and the source electrode of the p-channel TFT 13 receives a capacitor (C1) 18 that retains capacitance. Although the display device in FIG. 9 includes two scanning signal lines (Gates 1 and 2) and six emission control signal lines (Sigs 1 to 6), or pixel units arranged in a 2-by-6 matrix, a larger number of pixel units may be used.

Figure 1A:
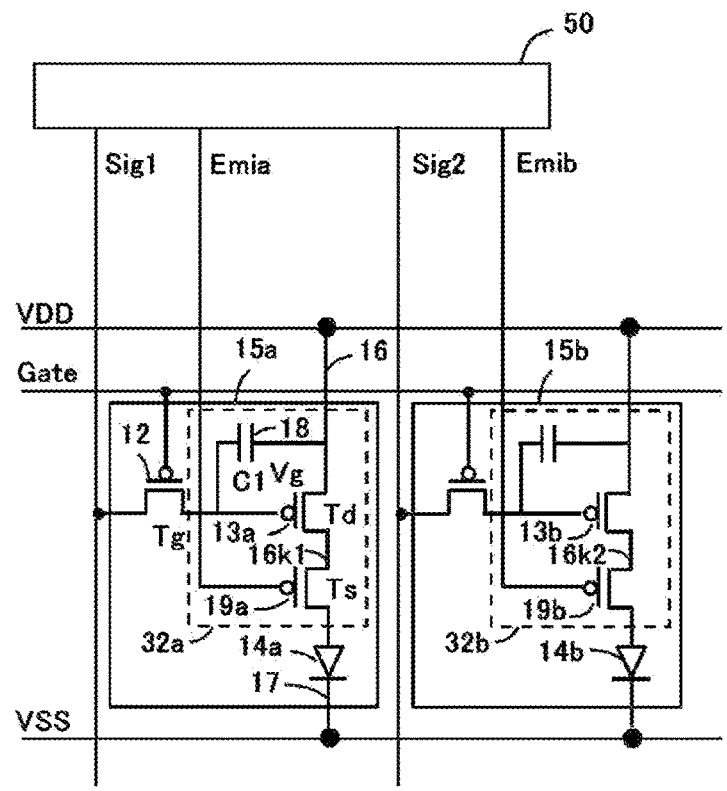
FIG. 1A is a circuit diagram of two pixel units respectively including two differently colored emissive micro-LEDs in a display device according to an embodiment of the present disclosure.

FIGS. 1A to 6 show display devices according to one or more embodiments of the present disclosure. As shown in FIG. 1A, the display device includes, on the substrate 1 (shown in FIG. 8A), a first pixel unit 15a including a first micro-LED 14a, and a second pixel unit 15b including a second micro-LED 14b with a differently colored emission and a different level of luminous efficiency from the first micro-LED 14a, and an emission controller 50 to control the light intensities of the first micro-LED 14a and the second micro-LED 14b. The first pixel unit 15a includes a first current control switch 13a to control a drive current supplied to the first micro-LED 14a, and a first period control switch 19a to control an emission period of the first micro-LED 14a. The second pixel unit 15b includes a second current control switch 13b to control a drive current supplied to the second micro-LED 14b, and a second period control switch 19b to control an emission period of the second micro-LED 14b. The first current control switch 13a, the first period control switch 19a, the second current control switch 13a, and the second period control switch 19b are connected to the emission controller 50. The first pixel unit 15a includes a drive circuit 32a including a p-channel TFT as the first current control switch 13a and a p-channel TFT as the first period control switch 19a. The second pixel unit 15b includes a drive circuit 32a including a p-channel TFT as the second current control switch 13b and a p-channel TFT as the second period control switch 19b.

The above structure produces the advantageous effects described below. The differently colored emissive first micro-LED 14a and second micro-LED 14b each have an independently controllable emission period. This structure allows precise control of the light intensities (luminance) of the differently colored emissive first micro-LED 14a and second micro-LED 14b having different levels of luminous efficiency with respect to a drive current. This structure thus enables high tone, high definition display and reduces the likelihood of deteriorating image quality such as uneven luminance. The first period control switch 19a and the second period control switch 19b to respectively control the emission periods of the first micro-LED 14a and the second micro-LED 14b are located inside the pixel units, rather than outside the pixel units, for example, at the periphery of the active area (pixel area), thus downsizing the display device. In addition, a single drive current line (power source current line) for supplying a drive current (power source current) is used, rather than multiple drive current lines corresponding to the differently colored emissive first micro-LED 14a and second micro-LED 14b. This structure simplifies the wiring and reduces the cost of the display device.

In the display device according to the present embodiment, the substrate 1 may be a translucent substrate such as a glass substrate and a plastic substrate, or a non-translucent substrate such as a ceramic substrate, a non-translucent plastic substrate, and a metal substrate. The substrate 1 may further be a composite substrate including a laminate of a glass substrate and a plastic substrate, a laminate of a glass substrate and a ceramic substrate, a laminate of a glass substrate and a metal substrate, or a laminate of at least any two of the above substrates formed from different materials. The substrate 1 including an electrically insulating substrate, such as a glass substrate, a plastic substrate, or a ceramic substrate, facilitates formation of wiring conductors. The substrate 1 may be rectangular, circular, oval, trapezoidal, or in any other shape.

The micro-LEDs used in the display device according to the present embodiment are backlight-free, self-luminous, and in chips mountable on the substrate 1. The micro-LEDs have a high level of luminous efficiency with low power consumption and have a long service life. The micro-LEDs are also small and easily connectable to electrode pads. The display device can thus perform high-quality image display and facilitate repair of the micro-LEDs. The micro-LEDs are mounted vertically on (perpendicularly to) the mount surface 1a (shown in FIGS. 8A and 8B) of the substrate 1. The mounted micro-LEDs include, for example, a positive electrode, an emissive layer, and a negative electrode stacked in this order from near the mount surface 1a. In some embodiments, the micro-LED may include a negative electrode, an emissive layer, and a positive electrode stacked in this order from near the mount surface 1a. In some embodiments, the micro-LEDs may be mounted laterally on (parallel to) the mount surface 1a of the substrate 1. The mounted micro-LEDs may include a positive electrode, an emissive layer, and a negative electrode aligned in this order.

Each micro-LED rectangular as viewed in plan may have, but is not limited to, each side with a length of about 1 to 100 μm inclusive, or more specifically about 3 to 10 μm inclusive.

The first micro-LED 14a in the first pixel unit 15a and the second micro-LED 14b in the second pixel unit 15b emit light of different colors. In some embodiments, the first micro-LED 14a located in the first pixel unit 15a may emit red, orange, red-orange, red-violet, or violet light. The second micro-LED 14b located in the second pixel unit 15b may emit green or yellow-green light. The first micro-LED 14a and the second micro-LED 14b may emit light of a color opposite from this. In some embodiments, the first micro-LED 14a located in the first pixel unit 15a may emit red, orange, red-orange, red-violet, or violet light. The second micro-LED 14b located in the second pixel unit 15b may emit blue light. The first micro-LED 14a and the second micro-LED 14b may emit light of a color opposite from this. In some embodiments, the micro-LED 14a located in the first pixel unit 15a may emit green or yellow-green light. The micro-LED 14b located in the second pixel unit 15b may emit blue light. The micro-LED 14a and the micro-LED 14b may emit light of a color opposite from this. This structure facilitates fabrication of a color display device with a specific color.

Figure 1B:
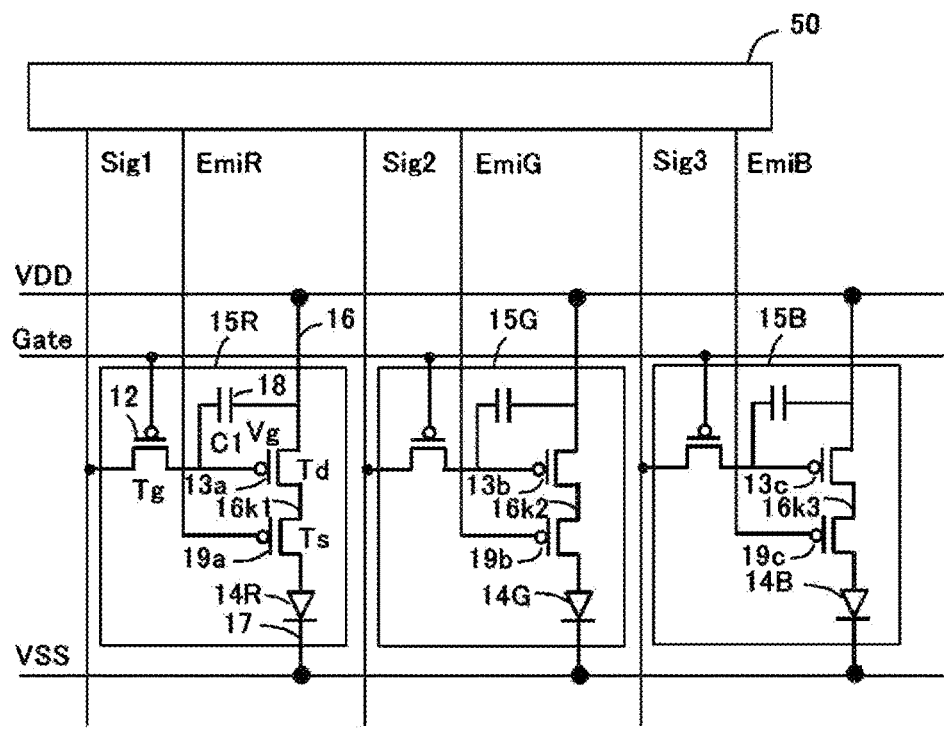
FIG. 1B is a circuit diagram of three pixel units respectively including a red micro-LED, a green micro-LED, and a blue micro-LED in the display device according to the embodiment of the present disclosure.

As shown in FIG. 1B, the three pixel units 15R, 15G, and 15B may be aligned in order laterally (in the row direction) or vertically (in the column direction). The pixel unit 15R includes a red micro-LED 14R. The pixel unit 15G includes a green micro-LED 14G. The pixel unit 15B includes a blue micro-LED 14G. In some embodiments, the red micro-LED 14R may emit red, orange, red-orange, red-violet, or violet light. The green micro-LED 14G may emit green or yellow-green light. The blue micro-LED 14B may emit blue light.

A positive electrode pad and a negative electrode pad are located on a drive line, such as a first drive line 16k1 (shown in FIGS. 1A and 1B) of a micro-LED 14 (hereafter, micro-LEDs such as the first micro-LED 14a and the second micro-LED 14b are collectively referred to as the micro-LEDs 14). The positive electrode pad is bonded to a positive electrode of the micro-LED 14 with a conductive connector, such as solder and a thick-film conductive layer. The negative electrode pad is bonded to a negative electrode of the micro-LED 14 with a conductive connector, such as solder. The positive electrode pad and the negative electrode pad are conductor layers including, for example, tantalum (Ta), tungsten (W), titanium (Ti), molybdenum (Mo), aluminum (Al), chromium (Cr), silver (Ag), or copper (Cu). The positive electrode pad and the negative electrode pad may be metal layers including Mo/Al/Mo layers (indicating a stack of a Mo layer, an Al layer, and a Mo layer in this order) or metal layer(s) including an Al layer, Al/Ti layers, Ti/Al/Ti layers, a Mo layer, Mo/Al/Mo layers, Ti/Al/Mo layers, Mo/Al/Ti layers, a Cu layer, a Cr layer, a Ni layer, or a Ag layer. The positive and negative electrodes of the micro-LED 14 may have the same composition as the positive and negative electrode pads.

To improve the conductive connection of the positive electrode pad and the negative electrode pad to the micro-LED 14 with a conductive connector such as solder, the positive electrode pad and the negative electrode pad may have rough surfaces. The roughness allows the conductive connector to be anchored to the rough surfaces with higher bonding strength. The rough surfaces may have an arithmetic mean roughness of about 1 to 100 μm. The surfaces of the positive electrode pad and the negative electrode pad may be roughened by, for example, etching or dry etching or controlling the film deposition time and temperature in forming the positive electrode pad and the negative electrode pad with a thin film formation method, such as chemical vapor deposition (CVD). Grain structures such as giant single crystal grains and giant polycrystal grains may be formed in the thin film.

Each pixel unit 15 (hereafter, pixel units such as the first pixel unit 15a are collectively referred to as the pixel unit 15) serves as a display unit. Controlling the light intensities (luminance) of many such micro-LEDs 14 enables display of tones in the corresponding pixel unit 15. A color display device may include sets of color display units each including a subpixel unit with a red-light emissive micro-LED 14R, a subpixel unit with a green-light emissive micro-LED 14G, and a subpixel unit with a blue-light emissive micro-LED 14B to enable display of color tones. The display device includes many such sets of color display units, enabling color display.

The first pixel unit 15a includes the drive circuit (element controller) 32a including TFTs serving as a switch and a control element for controlling the emission or non-emission state and the light intensity of the first micro-LED 14a. The drive circuit 32a may be located below the first micro-LED 14a with an insulating layer between them. The second pixel unit 15b includes a drive circuit 32b including TFTs serving as a switch and a control element for controlling the emission or non-emission state and the light intensity of the second micro-LED 14b. The drive circuits 32b may be located below the second micro-LED 14b with an insulating layer between them. This structure downsizes the first pixel unit 15a and the second pixel unit 15b, enabling high-quality image display in the display device according to the present embodiment.

In the display device according to the present embodiment, a p-channel TFT (Ts) as the first period control switch 19a may be located on the first drive line 16k1 connecting a p-channel TFT (Td) as the first current control switch 13a and the first micro-LED 14a. This structure includes the first period control switch 19a immediately upstream from the first micro-LED 14a, thus facilitating control of the emission period of the first micro-LED 14a. The p-channel TFT as the first period control switch 19a controls the emission or non-emission state of the first micro-LED 14a. In response to an emission or non-emission control signal (low-level signal, Emi) input into the gate electrode of the p-channel TFT, the p-channel TFT has its channel becoming conductive to enter an on-state. This then allows the drive signal (VDD) to be input, through the first drive line 16k1, into the first micro-LED 14a, which then emits light. Similarly in the second pixel unit 15b, the p-channel TFT (Ts) as the second period control switch 19b may be located on the second drive line 16k2 connecting the p-channel TFT (Td) as the second current control switch 13b and the second micro-LED 14b.

In the display device according to the present embodiment, the second micro-LED 14b has a higher level of luminous efficiency than the first micro-LED 14a. The emission controller 50 may control the first micro-LED 14a to have an integral of a drive current supplied to the first micro-LED 14a during its emission period that is larger than an integral of a drive current supplied to the second micro-LED 14b. In this case, the emission periods can be, for example, shorter to drive the micro-LEDs at higher frame frequencies. In other words, the color display device may be driven with a higher degree of freedom. This structure may more easily set white balance.

Figure 5:
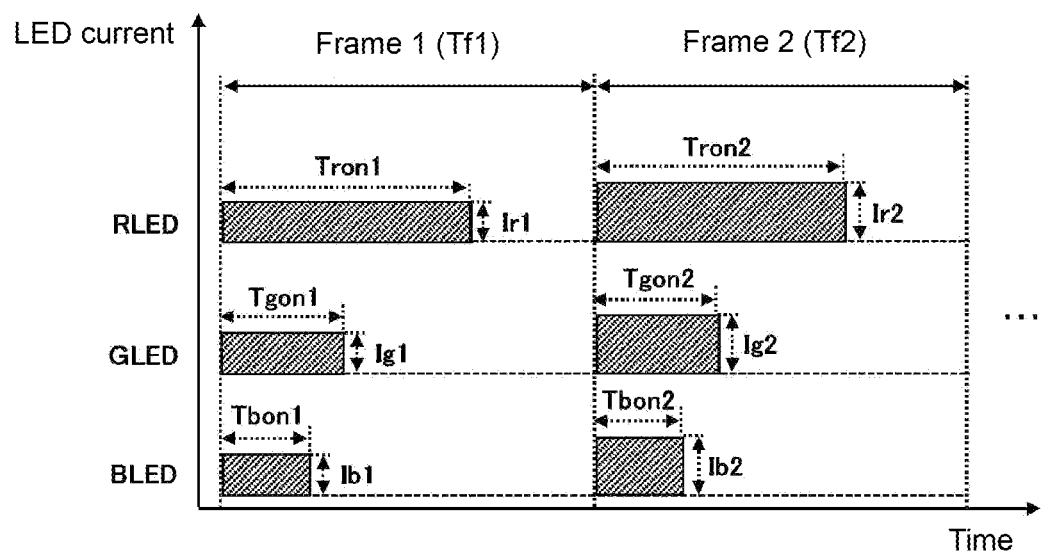
FIG. 5 is a graph showing a red micro-LED, a green micro-LED, and a blue micro-LED each having an independently controllable emission period and an independently controllable drive current in a display device according to another embodiment of the present disclosure.
Figure 6:
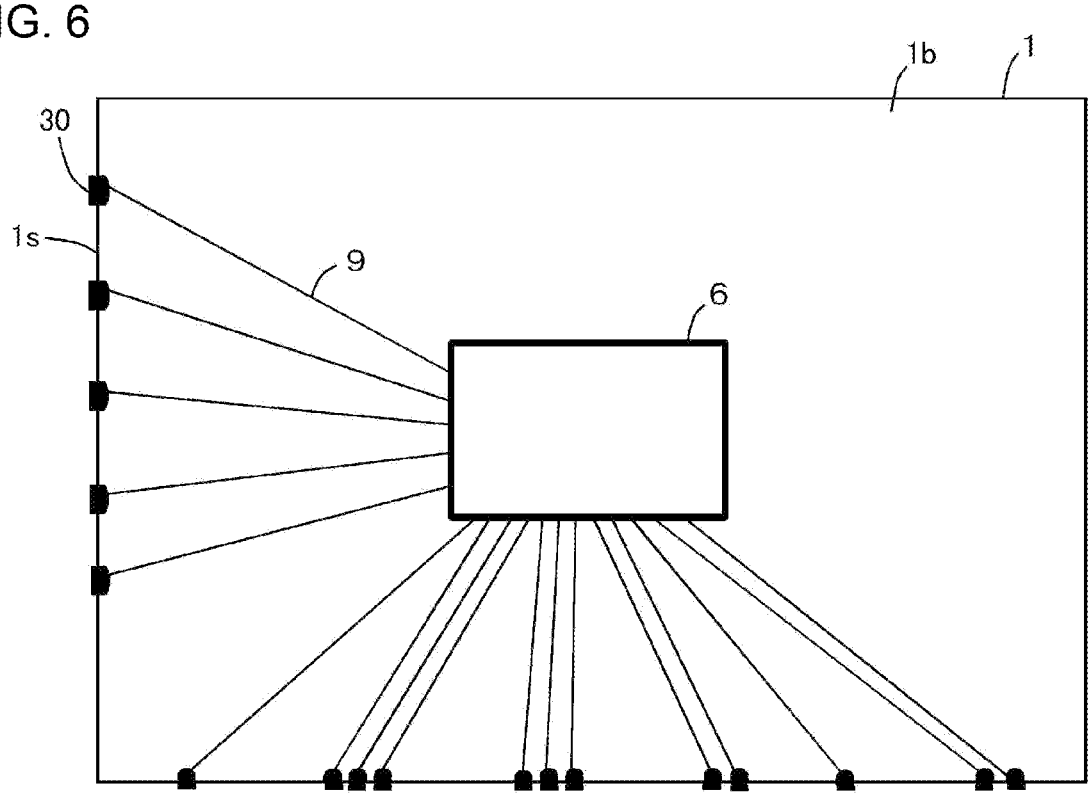
FIG. 6 is a plan view of a driver and back wiring located on an opposite surface of a substrate in a display device according to another embodiment of the present disclosure.

As shown in FIGS. 1B and 5, the display device according to the present embodiment includes, on the substrate 1, a first pixel unit 15R including the red micro-LED (RLED) 14R as the red-light emissive first micro-LED, a second pixel unit 15G including the green micro-LED (GLED) 14G as the green-light emissive second micro-LED, and a third pixel unit including the blue micro-LED (BLED) 14B as the blue-light emissive third micro-LED, and the emission controller 50 to control the light intensities of the red micro-LED 14R, the green micro-LED 14G, and the blue micro-LED 14B. The first pixel unit 15R includes the first current control switch 13a to control a drive current supplied to the red micro-LED 14R, and the first period control switch 19a to control an emission period of the red micro-LED 14R. The second pixel unit 15G includes the second current control switch 13b to control a drive current supplied to the green micro-LED 14G, and the second period control switch 19b to control an emission period of the green micro-LED 14G. The third pixel unit 15B includes a third current control switch 13c to control a drive current supplied to the blue micro-LED 14B, and the third period control switch 19c to control an emission period of the blue micro-LED 14B. The first current control switch 13a, the first period control switch 19a, the second current control switch 13b, the second period control switch 19b, the third current control switch 13c, and the third period control switch 19c are connected to the emission controller 50.

The above structure produces the advantageous effects described below. The differently colored emissive red first micro-LED 14R, green micro-LED 14G, and blue micro-LED 14B each have an independently controllable emission period. This structure allows precise control of the light intensities (luminance) of the differently colored emissive red micro-LED 14R, green micro-LED 14G, and blue micro-LED 14B having different levels of luminous efficiency with respect to a drive current. Thus, this structure enables high tone, high definition color display and reduces the likelihood of deteriorating image quality such as uneven luminance. The first period control switch 19a, the second period control switch 19b, and the third period control switch 19c to respectively control the emission periods of the red micro-LED 14R, the green micro-LED 14G, and the blue micro-LED 14B are located inside the pixel units, rather than outside the pixel units, for example, at the periphery of the active area (pixel area), thus downsizing the display device. In addition, a single drive current line (power source current line) for supplying a drive current (power source current) is used, rather than multiple drive current lines corresponding to the differently colored emissive red micro-LED 14R, green micro-LED 14G, and blue micro-LED 14B. This structure simplifies the wiring and reduces the cost of the display device.

In the display device according to the present embodiment, the first period control switch 19a may be located on the first drive line 16k1 connecting the first current control switch 13a and the red micro-LED 14R. The second period control switch 19b may be located on the second drive line 16k2 connecting the second current control switch 13b and the green micro-LED 14G. The third period control switch 19c may be located on a third drive line 16k3 connecting the third current control switch 13c and the blue micro-LED 14B. This structure includes the first period control switch 19a immediately upstream from the red micro-LED 14R, facilitating control of the emission period of the red micro-LED 14R. Similarly, this structure facilitates control of the emission periods of the green micro-LED 14G and the blue micro-LED 14B.

In the display device according to the present embodiment, the red micro-LED 14R, the green micro-LED 14G, and the blue micro-LED 14B have different and increasing levels of luminous efficiency in this order. The emission controller 50 may control the LEDs to satisfy S1>S2>S3, where S1 is an integral of a drive current supplied to the red micro-LED 14R during its emission period, S2 is an integral of a drive current supplied to the green micro-LED 14G during its emission period, and S3 is an integral of a drive current supplied to the blue micro-LED 14B during its emission period. In this case, the emission periods can be, for example, shorter to drive the micro-LEDs at higher frame frequencies. In other words, the color display device may be driven with a higher degree of freedom. This structure may more easily set white balance.

The emission periods may be controlled to satisfy Tr>Tg>Tb with the integrals satisfying S1>S2>S3, where Ir is a drive current and Tr is an emission period of the red micro-LED 14R, Ig is a drive current and Tg is an emission period of the green micro-LED 14G, and Ib is a drive current and Tb is an emission period of the blue micro-LED 14B. In this case, the emission periods may be set to decrease in the order of increasing levels of luminous efficiency with respect to a drive current. As shown in FIG. 5, Ir=Ig=Ib, where Ir is a drive current of the red micro-LED 14R, Ig is a drive current of the green micro-LED 14G, and Ib is a drive current of the blue micro-LED 14B. This structure allows the light intensities of the multiple differently colored emissive micro-LEDs 14 to be controlled simply by their emission periods.

As shown in FIG. 5, the red micro-LED 14R, the green micro-LED 14G, and the blue micro-LED 14B have the same emission start time, but may have different emission start times. The light emissions (lightning) may start in the order of Tbs, Trs, and Tgs, where Trs is an emission start time of the red micro-LED 14R, Tgs is an emission start time of the green micro-LED 14G, and Tbs is an emission start time of the blue micro-LED 14B. In this case, the light emissions start in order of increasing visual sensitivities, or in the order of the blue micro-LED 14B, the red micro-LED 14R, and the green micro-LED 14G, enabling their visual sensitivities to be substantially the same.

When the red micro-LED 14R, the green micro-LED 14G, and the blue micro-LED 14B have different emission start times, the emission periods of the red micro-LED 14R, the green micro-LED 14G, and the blue micro-LED 14B may be overlapped with one another. In this case, these micro-LEDs 14 enable display of color tones. The overlapped emission periods may be longer than the non-overlapped emission periods. This structure enables display of color tones more easily.

When Trs, Tgs, and Tbs are the same, the rise times of light emission pulses (drive signal waveforms) may be set to decrease in the order of the blue micro-LED 14B, the red micro-LED 14R, and the green micro-LED 14G. This structure also enables the visual sensitivities to be substantially the same.

In the display device according to the present embodiment, the drive currents may be set to satisfy Ir>Ig>Ib with the integrals satisfying S1>S2>S3. In this case, the drive currents may be set to decrease in the order of increasing levels of luminous efficiency with respect to a drive current. In addition, the emission periods may be set to satisfy Tr=Tg=Tb. This structure allows the light intensities of the micro-LEDs 14 to be controlled simply by current values.

In the display device according to the present embodiment, Tr, Tg, and Tb are settable in the range greater than 0 to about 4 milliseconds (ms) (frame frequency of about 240 Hz). Ir, Ig, and Ib are settable in the range greater than 0 to about 30 microamperes (μA). When, for example, small micro-LEDs 14 are used, Ir, Ig, and Ib may be settable in the range greater than 0 to about 3 μA.

In the graph in FIG. 5, the drive currents are set to satisfy Ir=Ig=Ib and be constant. However, Ir, Ig, and Ib each may be set to increase gradually or in a stepwise manner, reach a maximum value (peak), and then decrease gradually or in a stepwise manner. In this case, Tr, Tg, and Tb each can be set shorter to have the same integrals S1, S2, and S3 as the integrals with the constant drive currents satisfying Ir=Ig=Ib. The emission periods set shorter can thus drive the micro-LEDs at higher frame frequencies. Ir, Ig, and Ib each may be set to increase gradually or in a stepwise manner. In this case as well, Tr, Tg, and Tb each can be set still shorter to have the same integrals S1, S2, and S3 as the integrals with the constant drive currents satisfying Ir=Ig=Ib. The emission periods set still shorter can thus drive the micro-LEDs at still higher frame frequencies. In this case, Ir, Ig, and Ib may have increasing rates or slopes (mean increase rates or mean slopes in the increase in a stepwise manner) in the order of Ib, Ir, and Ig. This structure enables visual sensitivities to be substantially the same.

Figure 2:
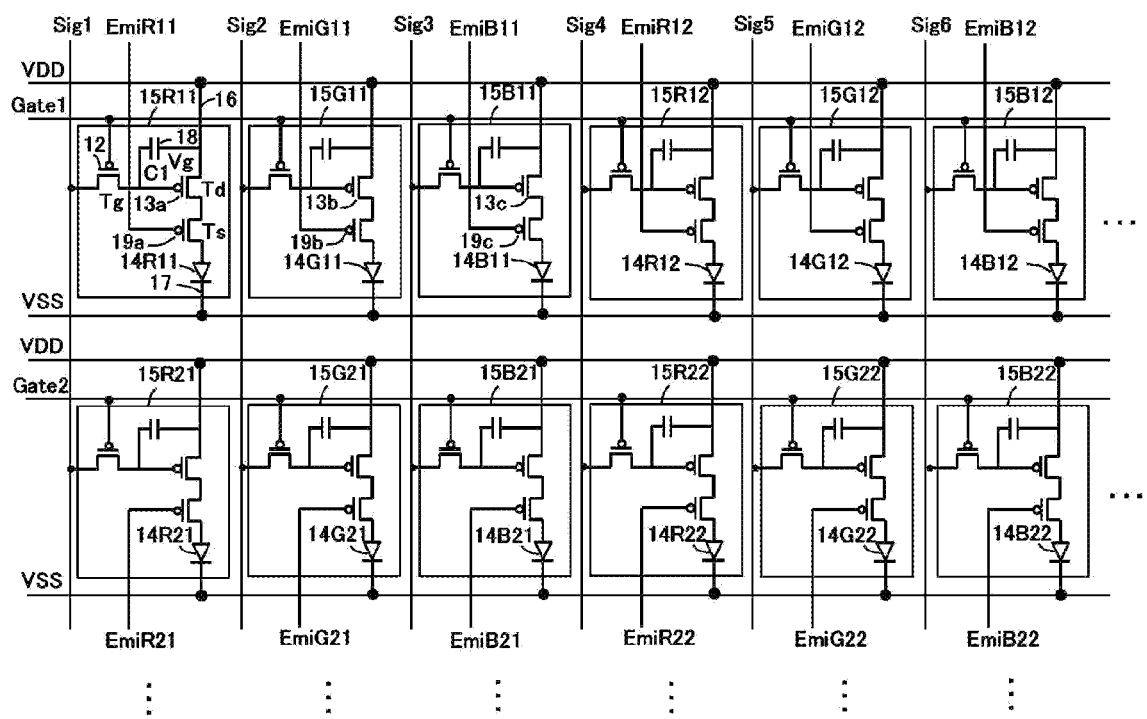
FIG. 2 is a circuit diagram of multiple pixel units including three pixel units respectively including a red micro-LED, a green micro-LED, and a blue micro-LED in a display device according to another embodiment of the present disclosure.

As shown in FIG. 2, the display device according to the present embodiment includes the pixel units 15R11, 15G11, 15B11, 15R12, 15G12, 15B12, . . . in the first row, and the pixel units 15R21, 15G21, 15B21, 15R22, 15G22, 15B22, . . . in the second row. The pixel units 15R11 to 15B12 in the first row include a corresponding red micro-LED 14R11, a green micro-LED 14G11, a blue micro-LED 14B11, a red micro-LED 14R12, a green micro-LED 14G12, and a blue micro-LED 14B12. The red micro-LED 14R11, the green micro-LED 14G11, the blue micro-LED 14B11, the red micro-LED 14R12, the green micro-LED 14G12, and the blue micro-LED 14B12 have emission periods controllable by the p-channel TFTs 19 (p-channel TFTs 19a, 19b, and 19c are collectively referred to as p-channel TFTs 19) and by corresponding gate control signal lines EmiR11, EmiG11, EmiB11, EmiR12, EmiG12, and EmiB12. The pixel units 15R21 to 15B22 in the second row include a corresponding red micro-LED 14R21, a green micro-LED 14G21, a blue micro-LED 14B21, a red micro-LED 14R22, a green micro-LED 14G22, and a blue micro-LED 14B22. The red micro-LED 14R21, the green micro-LED 14G21, the blue micro-LED 14B21, the red micro-LED 14R22, the green micro-LED 14G22, and the blue micro-LED 14B22 have emission periods controllable by the p-channel TFTs 19 and by corresponding gate control signal lines EmiR21, EmiG21, EmiB21, EmiR22, EmiG22, and EmiB22.

Scanning signal lines (Gates 1 and 2) are electrically connected either to a scanning signal line drive circuit located on the frame 1g in the substrate 1 or to the driver 6 located on an opposite surface 1b (shown in FIG. 8A) of the substrate 1 to be driven and controlled. Emission control signal lines (Sigs 1 to 6) are electrically connected either to an emission control signal line drive circuit located on the frame 1g in the substrate 1 or to the driver 6 located on the opposite surface 1b of the substrate 1 to be driven and controlled. Drive current lines (power current lines) (VDD and VSS) are electrically connected either to power pads for external connection located on the frame 1g in the substrate 1 or to the driver 6 located on the opposite surface 1b of the substrate 1. Gate control signal lines EmiR 11 to EmiB 22 are electrically connected either to an emission control signal line drive circuit located on the frame 1g in the substrate 1 or to the driver 6 located on the opposite surface 1b of the substrate 1 to be driven and controlled. The emission controller 50 may be included in the emission control signal line drive circuit or the driver 6.

Figure 3:
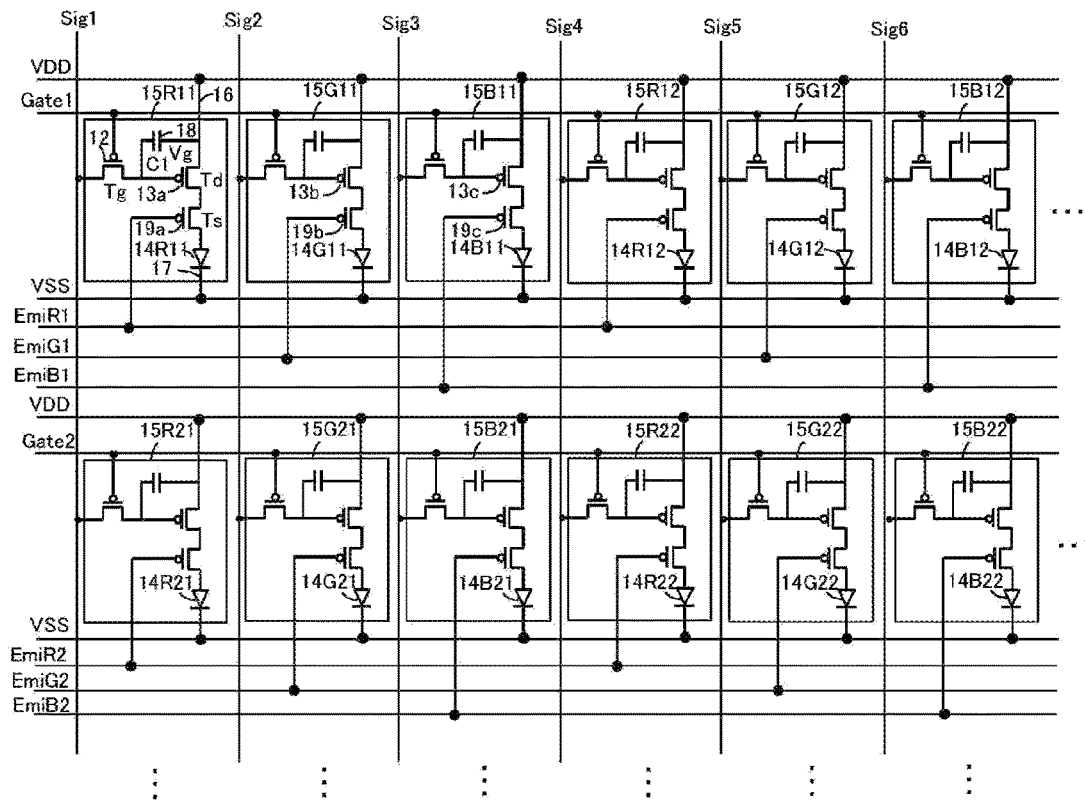
FIG. 3 is a circuit diagram of multiple pixel units including three pixel units respectively including a red micro-LED, a green micro-LED, and a blue micro-LED in a display device according to another embodiment of the present disclosure.

As shown in FIG. 3, the display device according to the present embodiment includes, in the pixel units 15R11 to 15B12 in the first row, the multiple micro-LEDs 14 including the multiple red-light emissive red micro-LEDs 14R11 and 14R12, the multiple green-light emissive green micro-LEDs 14G11 and 14G12, and the multiple blue-light emissive blue micro-LEDs 14B11 and 14B12. The red micro-LEDs 14R11 and 14R12 may have the same emission period. The green micro-LEDs 14G11 and 14G12 may have the same emission period. The blue micro-LEDs 14B11 and 14B12 may have the same emission period. In this case, the emissive micro-LEDs 14 with the same color having the same level of luminous efficiency can thus have the common emission period. This structure simplifies the wiring.

In other words, the p-channel TFTs 19 respectively connected to the red micro-LEDs 14R11 and 14R12 are commonly connected to a gate control signal line EmiR1, the p-channel TFTs 19 respectively connected to the green micro-LEDs 14G11 and 14G12 are commonly connected to a gate control signal line EmiG1, and the p-channel TFTs 19 respectively connected to the blue micro-LEDs 14B11 and 14B12 are commonly connected to a gate control signal line EmiB1. This structure allows the emissive micro-LEDs 14 with the same color to have the same emission period. Similarly in the pixel units 15R21 to 15B22 in the second row, the p-channel TFTs 19 respectively connected to the red micro-LEDs 14R21 and 14R22 are commonly connected to a gate control signal line EmiR2, the p-channel TFTs 19 respectively connected to the green micro-LEDs 14G21 and 14G22 are commonly connected to a gate control signal line EmiG2, and the p-channel TFTs 19 respectively connected to the blue micro-LEDs 14B21 and 14B22 are commonly connected to a gate control signal line EmiB2. This structure allows the emissive micro-LEDs 14 with the same color to have the same emission period.

Figure 4:
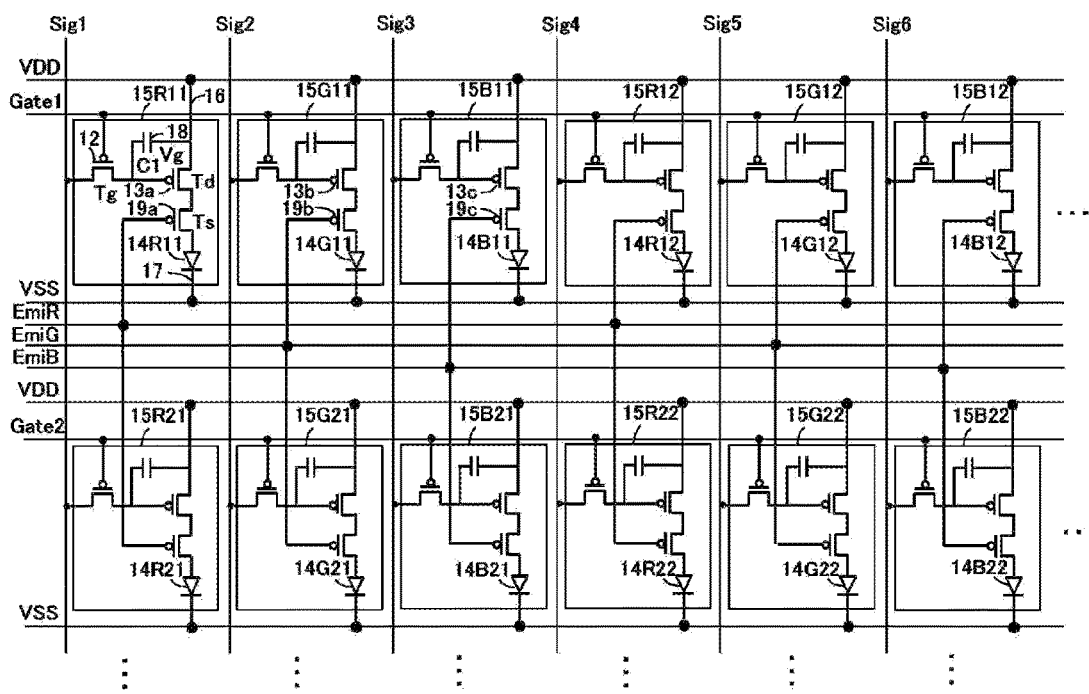
FIG. 4 is a circuit diagram of multiple pixel units including three pixel units respectively including a red micro-LED, a green micro-LED, and a blue micro-LED in a display device according to another embodiment of the present disclosure.

In some embodiments, the structure described in FIG. 4 may be used. The p-channel TFTs 19 respectively connected to the red micro-LEDs 14R11 and 14R12 in the first row and the red micro-LEDs 14R21 and 14R22 in the second row are commonly connected to a gate control signal line EmiR. The p-channel TFTs 19 respectively connected to the green micro-LEDs 14G11 and 14G12 in the first row and the green micro-LEDs 14G21 and 14G22 in the second row are commonly connected to a gate control signal line EmiG. The p-channel TFTs 19 respectively connected to the blue micro-LEDs 14B11 and 14B12 in the first row and the blue micro-LEDs 14B21 and 14B22 in the second row are commonly connected to a gate control signal line EmiB. This structure allows the micro-LEDs 14 with the same color to have the same emission period.

In some embodiments, all the micro-LEDs 14 with the same color located in the display area may have the same emission period.

Figure 8B:
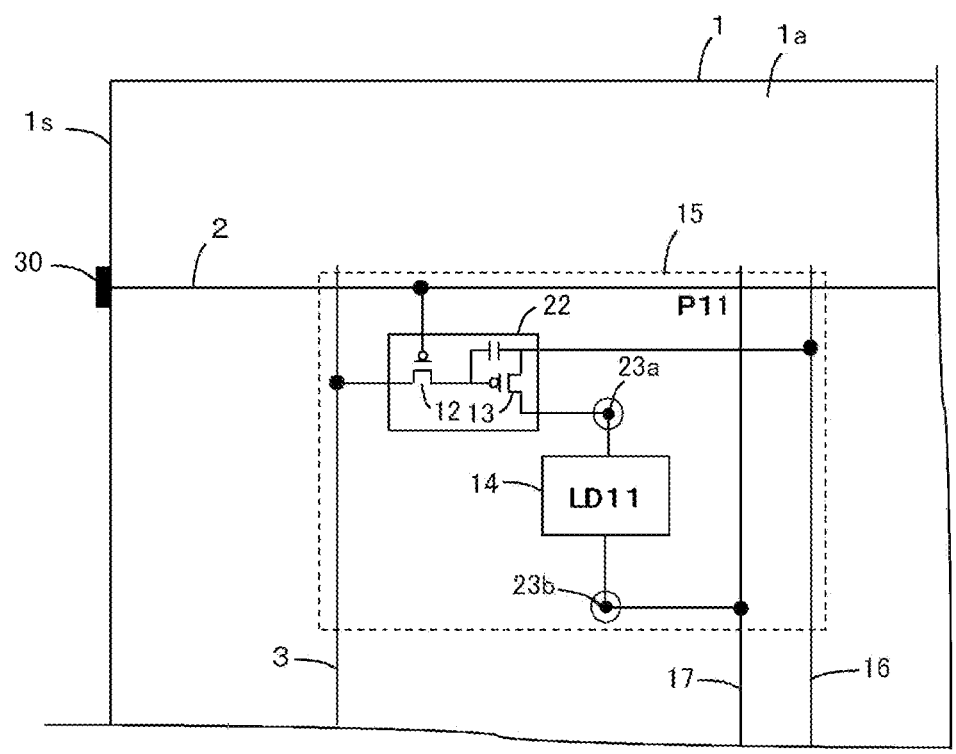
FIG. 8B is an enlarged plan view of one pixel unit in FIG. 7.

In the display device according to the present embodiment, the substrate 1 has the opposite surface 1b opposite to the mount surface 1a, and the side surface 1s (shown in FIGS. 8A and 8B). The side surface 1s receives the side wiring 30 (shown in FIG. 8B), and the opposite surface 1b receives the driver 6 (shown in FIG. 8A). The micro-LEDs 14 may be connected to the driver 6 with the side wiring 30. This compact color display device includes the smaller frame 1g and simplified wiring. Thus, a large display device (multi-display) fabricated by tiling the multiple display devices may have high image quality with inconspicuous frames 1g.

The driver 6 may include driving elements such as ICs and LSI circuits mounted by chip on glass or may be a circuit board on which driving elements are mounted. The driver 6 may also be a thin film circuit including, for example, a TFT that includes a semiconductor layer including low temperature polycrystalline silicon (LTPS) formed directly on the opposite surface 1b of the substrate 1; which may be a glass substrate, by a thin film formation method such as CVD.

The side wiring 30 may be formed from a conductive paste including conductive particles such as Ag, Cu, Al, and stainless steel, an uncured resin component, an alcohol solvent, and water. The conductive paste may be cured by heating, photocuring using ultraviolet ray irradiation, or combination of heating and photocuring. The side wiring 30 may also be formed by a thin film formation method such as plating, vapor deposition, and CVD. The substrate 1 may have a groove on the side surface 1s to receive the side wiring 30. This allows the conductive paste to be easily received in the groove or in an intended portion on the side surface 1s.

The emission controller 50 may be included in the emission control signal line drive circuit or the scanning signal line drive circuit located on the frame 1g in the mount surface 1a of the substrate 1, or in the driver 6 located on the opposite surface 1b of the substrate 1. The emission controller 50 included in the driver 6 facilitates fabrication of a compact color display device with the smaller frame 1g and simplified wiring. The emission controller 50 may be a programming software stored in a memory area, or driving elements such as ICs and LSI circuits. The memory area includes a read-only memory (ROM) or a random-access memory (RAM) included in the driving elements such as ICs and LSI circuits, which form the emission control signal line drive circuit, the scanning signal line drive circuit, or the driver 6.

The display device according to the present embodiment may include multiple substrates 1 each including multiple micro-LEDs 14. The multiple substrates 1 may be arranged in a grid on the same plane. The substrates 1 may be connected (tiled) together with their side surfaces bonded with, for example, an adhesive. The display device can thus be composite and large, forming a multi-display.

The display device according to the present embodiment may form a light-emitting device. The light-emitting device can be used as, for example, a printer head for an image formation device and other devices, an illumination device, a signboard, and a notice board.

The display device according to one or more embodiments of the present disclosure is not limited to the above embodiments and may include design alterations and improvements as appropriate. For example, the substrate 1 may be non-translucent, and may be a glass substrate colored in black, gray, or other colors, or a glass substrate including frosted glass.

The present disclosure may be implemented in the following forms.

A display device according to one or more embodiments of the present disclosure includes a first pixel unit located on a substrate, the first pixel unit including a first micro-LED, a first current control switch configured to control a drive current to be supplied to the first micro-LED, and a first period control switch configured to control an emission period of the first micro-LED. The display device includes a second pixel unit located on the substrate, the second pixel unit including a second micro-LED having a differently colored emission and a different level of luminous efficiency from the first micro-LED, a second current control switch configured to control a drive current to be supplied to the second micro-LED, and a second period control switch configured to control an emission period of the second micro-LED. And the display device includes an emission controller that controls light intensities of the first micro-LED and the second micro-LED. The first current control switch, the first period control switch, the second current control switch, and the second period control switch are connected to the emission controller.

In the display device according to one or more embodiments of the present disclosure, the first period control switch may be located on a first drive line connecting the first current control switch and the first micro-LED, and the second period control switch may be located on a second drive line connecting the second current control switch and the second micro-LED.

In the display device according to one or more embodiments of the present disclosure, the second micro-LED may have a higher level of luminous efficiency than the first micro-LED, and the emission controller may control the first micro-LED to have an integral of a drive current supplied to the first micro-LED during the emission period that is larger than an integral of a drive current supplied to the second micro-LED.

In the display device according to one or more embodiments of the present disclosure, the substrate may comprise a mount surface on which the first pixel unit and the second pixel unit are located, an opposite surface opposite to the mount surface, and a side surface. The side surface may receive side wiring, and the opposite surface may receive a driver. The first micro-LED and the second micro-LED may be connected to the driver with the side wiring.

A display device according to one or more embodiments of the present disclosure includes a first pixel unit located on a substrate, the first pixel unit including a first micro-LED configured to emit red light, a first current control switch configured to control a drive current to be supplied to the first micro-LED, and a first period control switch configured to control an emission period of the first micro-LED. The display device includes a second pixel unit located on the substrate, the second pixel unit including a second micro-LED configured to emit green light, a second current control switch configured to control a drive current to be supplied to the second micro-LED, and a second period control switch configured to control an emission period of the second micro-LED. The display device includes a third pixel unit located on the substrate, the third pixel unit including a third micro-LED configured to emit blue light, a third current control switch configured to control a drive current to be supplied to the third micro-LED, and a third period control switch configured to control an emission period of the third micro-LED. And the display device includes an emission controller that controls light intensities of the first micro-LED, the second micro-LED, and the third micro-LED. The first current control switch, the first period control switch, the second current control switch, the second period control switch, the third current control switch, and the third period control switch are connected to the emission controller.

In the display device according to one or more embodiments of the present disclosure, the first period control switch may be located on a first drive line connecting the first current control switch and the first micro-LED, the second period control switch may be located on a second drive line connecting the second current control switch and the second micro-LED, and the third period control switch may be located on a third drive line connecting the third current control switch and the third micro-LED.

In the display device according to one or more embodiments of the present disclosure, the first micro-LED, the second micro-LED, and the third micro-LED may have different and increasing levels of luminous efficiency in an order of the first micro-LED, the second micro-LED, and the third micro-LED. The emission controller may control the first micro-LED, the second micro-LED, and the third micro-LED to satisfy S1>S2>S3, where S1 is an integral of a drive current supplied to the first micro-LED during the emission period of the first micro-LED, S2 is an integral of a drive current supplied to the second micro-LED during the emission period of the second micro-LED, and S3 is an integral of a drive current supplied to the third micro-LED during emission period of the third micro-LED.

In the display device according to one or more embodiments of the present disclosure, the substrate may comprise a mount surface on which the first pixel unit, the second pixel unit, and the third pixel unit are located, an opposite surface opposite to the mount surface, and a side surface. The side surface may receive side wiring, and the opposite surface may receive a driver. The first micro-LED, the second micro-LED, and the third micro-LED may be connected to the driver with the side wiring.

The display device according to one or more embodiments of the present disclosure includes a first pixel unit located on a substrate, the first pixel unit including a first micro-LED, a first current control switch configured to control a drive current to be supplied to the first micro-LED, and a first period control switch configured to control an emission period of the first micro-LED. The display device includes a second pixel unit located on the substrate, the second pixel unit including a second micro-LED having a differently colored emission and a different level of luminous efficiency from the first micro-LED, a second current control switch configured to control a drive current to be supplied to the second micro-LED, and a second period control switch configured to control an emission period of the second micro-LED. And the display device includes an emission controller that controls light intensities of the first micro-LED and the second micro-LED. The first current control switch, the first period control switch, the second current control switch, and the second period control switch are connected to the emission controller. This structure produces the effects described below.

The differently colored emissive first micro-LED and second micro-LED each have an independently controllable emission period. This structure allows precise control of the light intensities (luminance) of the differently colored emissive first micro-LED and second micro-LED having different levels of luminous efficiency with respect to a drive current. This structure thus enables high tone, high definition display and reduces the likelihood of deteriorating image quality such as uneven luminance. The first period control switch and the second period control switch to respectively control the emission periods of the first micro-LED and the second micro-LED are located inside the pixel units, rather than outside the pixel units, for example, at the periphery of the active area (pixel area), thus downsizing the display device. In addition, a single drive current line (power source current line) for supplying drive currents (power source currents) is used, rather than multiple drive current lines corresponding to the differently colored emissive first micro-LED and second micro-LED. This structure simplifies the wiring and reduces the cost of the display device.

In the display device according to one or more embodiments of the present disclosure, the first period control switch may be located on the first drive line connecting the first current control switch and the first micro-LED, and the second period control switch may be located on the second drive line connecting the second current control switch and the second micro-LED. This structure includes the first period control switch immediately upstream from the first micro-LED, facilitating control of the emission period of the first micro-LED. Similarly, this structure includes the second period control switch immediately upstream from the second micro-LED, facilitating control of the emission period of the second micro-LED.

In the display device according to one or more embodiments of the present disclosure, the second micro-LED may have a higher level of luminous efficiency than the first micro-LED, and the emission controller may control the first micro-LED to have an integral of a drive current supplied to the first micro-LED during its emission period that is larger than an integral of a drive current supplied to the second micro-LED. In this case, the emission periods can be, for example, shorter to drive the micro-LEDs at higher frame frequencies. In other words, the color display device may be driven with a higher degree of freedom. This structure may more easily set white balance.

In the display device according to one or more embodiments of the present disclosure, the substrate may comprise a mount surface on which the first pixel unit and the second pixel unit are located, an opposite surface opposite to the mount surface, and a side surface. The side surface may receive side wiring, and the opposite surface may receive a driver. With the first micro-LED and the second micro-LED connected to the driver with the side wiring, the compact color display device includes the smaller frame and simplified wiring. Thus, a large display device (multi-display) fabricated by tiling the multiple display devices may have high image quality with inconspicuous frames.

The display device according to one or more embodiments of the present disclosure includes a first pixel unit located on a substrate, the first pixel unit including a first micro-LED configured to emit red light, a first current control switch configured to control a drive current to be supplied to the first micro-LED, and a first period control switch configured to control an emission period of the first micro-LED. The display device includes a second pixel unit located on the substrate, the second pixel unit including a second micro-LED configured to emit green light, a second current control switch configured to control a drive current to be supplied to the second micro-LED, and a second period control switch configured to control an emission period of the second micro-LED. The display device includes a third pixel unit located on the substrate, the third pixel unit including a third micro-LED configured to emit blue light, a third current control switch configured to control a drive current to be supplied to the third micro-LED, and a third period control switch configured to control an emission period of the third micro-LED. And the display device includes an emission controller that controls light intensities of the first micro-LED, the second micro-LED, and the third micro-LED. The first current control switch, the first period control switch, the second current control switch, the second period control switch, the third current control switch, and the third period control switch are connected to the emission controller. This structure produces the effects described below.

The differently colored emissive first micro-LED, second micro-LED, and third micro-LED each have an independently controllable emission period. This structure allows precise control of the light intensities (luminance) of the differently colored emissive first micro-LED, second micro-LED, and third micro-LED having different levels of luminous efficiency with respect to a drive current. Thus, this structure enables high tone, high definition color display and reduces the likelihood of deteriorating image quality such as uneven luminance. The first period control switch, the second period control switch, and the third period control switch to respectively control the emission periods of the first micro-LED, the second micro-LED, and the third micro-LED are located inside the pixel units, rather than outside the pixel units, for example, at the periphery of the active area (pixel area), thus downsizing the display device. In addition, a single drive current line (power source current line) for supplying a drive current (power source current) is used, rather than multiple drive current lines corresponding to the differently colored emissive first micro-LED, second micro-LED, and third micro-LED. This structure simplifies the wiring and reduces the cost of the display device.

In the display device according to one or more embodiments of the present disclosure, the first period control switch may be located on the first drive line connecting the first current control switch and the first micro-LED, the second period control switch may be located on the second drive line connecting the second current control switch and the second micro-LED, and the third period control switch may be located on the third drive line connecting the third current control switch and the third micro-LED. This structure includes the first period control switch immediately upstream from the first micro-LED, facilitating control of the emission period of the first micro-LED. Similarly, this structure facilitates control of the emission periods of the second micro-LED and the third micro-LED.

In the display device according to one or more embodiments of the present disclosure, the first micro-LED, the second micro-LED, and the third micro-LED may have different and increasing levels of luminous efficiency in this order. The emission controller may control the first micro-LED, the second micro-LED, and the third micro-LED to satisfy S1>S2>S3, where S1 is an integral of a drive current supplied to the first micro-LED during its emission period, S2 is an integral of a drive current supplied to the second micro-LED during its emission period, and S3 is an integral of a drive current supplied to the third micro-LED during its emission period. In this case, the emission periods can be, for example, shorter to drive the micro-LEDs at higher frame frequencies. In other words, the color display device may be driven with a higher degree of freedom. This structure may more easily set white balance.

In the display device according to one or more embodiments of the present invention, the substrate may have a mount surface on which the first pixel unit, the second pixel unit, and the third pixel unit are located, an opposite surface opposite to the mount surface, and a side surface. The side surface may receive side wiring, and the opposite surface may receive a driver. With the first micro-LED, the second micro-LED, and the third micro-LED connected to the driver with the side wiring, the compact color display device includes the smaller frame and simplified wiring. Thus, a large display device (multi-display) fabricated by tiling the multiple display devices may have high image quality with inconspicuous frames.

INDUSTRIAL APPLICABILITY

The display device according to one or more embodiments of the present disclosure can be used in various electronic devices. Such electronic devices include composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, head-mounted displays (HMDs), digital display watches, and smartwatches.

The present disclosure may be embodied in various forms without departing from the spirit or the main features of the present disclosure. The embodiments described above are thus merely illustrative in all respects. The scope of the present disclosure is defined not by the description given above but by the claims. Any modifications and alterations contained in the claims fall within the scope of the present disclosure.

REFERENCE SIGNS LIST

1 substrate
1a mount surface
1b opposite surface
1s side surface
6 driver
13a first current control switch
13b second current control switch
13c third current control switch
14a first micro-LED
14b second micro-LED
14R red micro-LED as first micro-LED
14G green micro-LED as second micro-LED
14B blue micro-LED as third micro-LED
15a first pixel unit
15b second pixel unit
15R first pixel unit
15G second pixel unit
15B third pixel unit
16k1 first drive line
16k2 second drive line
16k3 third drive line
19a first period control switch
19b second period control switch
19c third period control switch
30 side wiring
50 emission controller

The invention claimed is:

1. A display device, comprising:
a first pixel unit located on a substrate, the first pixel unit including
a first micro-light-emitting diode (micro-LED) configured to emit red light,
a first current control switch configured to control a first drive current to be supplied to the first micro-LED, and
a first period control switch configured to control a first emission period of the first micro-LED;
a second pixel unit located on the substrate, the second pixel unit including
a second micro-LED configured to emit green light and having a differently colored emission and a different level of luminous efficiency from the first micro-LED,
a second current control switch configured to control a second drive current to be supplied to the second micro-LED, and
a second period control switch configured to control a second emission period of the second micro-LED; and
an emission controller configured to control light intensities of the first micro-LED and the second micro-LED,
wherein the first current control switch, the first period control switch, the second current control switch, and the second period control switch are connected to the emission controller, and
wherein the emission controller controls so that the first emission period and the second emission period are overlapped, so as to allow the first micro-LED prior to the second micro-LED to emit light, and so that the first drive current and the second drive current are each set to increase gradually or in a stepwise manner, and an increasing rate of the first drive current is greater than an increasing rate of the second drive current.

2. The display device according to claim 1, wherein
the first period control switch is located on a first drive line connecting the first current control switch and the first micro-LED, and
the second period control switch is located on a second drive line connecting the second current control switch and the second micro-LED.

3. The display device according to claim 1, wherein
the second micro-LED has a higher level of luminous efficiency than the first micro-LED, and the emission controller controls the first micro-LED to have an integral of a drive current supplied to the first micro-LED during the emission period that is larger than an integral of a drive current supplied to the second micro-LED.

4. The display device according to claim 1,
wherein the substrate comprises a mount surface on which the first pixel unit and the second pixel unit are located, an opposite surface opposite to the mount surface, and a side surface; and
wherein the side surface receives side wiring, the opposite surface receives a driver, and
the first micro-LED and the second micro-LED are connected to the driver with the side wiring.

5. A display device, comprising:
a first pixel unit located on a substrate, the first pixel unit including
   a first micro-light-emitting diode (micro-LED) configured to emit red light,
   a first current control switch configured to control a first drive current to be supplied to the first micro-LED, and
   a first period control switch configured to control a first emission period of the first micro-LED;
a second pixel unit located on the substrate, the second pixel unit including
   a second micro-LED configured to emit green light,
   a second current control switch configured to control a second drive current to be supplied to the second micro-LED, and
   a second period control switch configured to control a second emission period of the second micro-LED;
a third pixel unit located on the substrate, the third pixel unit including
   a third micro-LED configured to emit blue light,
   a third current control switch configured to control a third drive current to be supplied to the third micro-LED, and
   a third period control switch configured to control a third emission period of the third micro-LED; and
an emission controller configured to control light intensities of the first micro-LED, the second micro-LED, and the third micro-LED,
wherein the first current control switch, the first period control switch, the second current control switch, the second period control switch, the third current control switch, and the third period control switch are connected to the emission controller, and
wherein the emission controller controls so that the first emission period, the second emission period and the third emission period are overlapped, so as to allow the first micro-LED, the second micro-LED and the third micro-LED to emit light in an order of the third micro-LED, the first micro-LED and the second micro-LED, and so that the first drive current, the second drive current and the third drive current are each set to increase gradually or in a stepwise manner, an increasing rate of the third drive current is greater than an increasing rate of the first drive current, and the increasing rate of the first drive current is greater than an increasing rate of the second drive current.

6. The display device according to claim 5, wherein
the first period control switch is located on a first drive line connecting the first current control switch and the first micro-LED,
the second period control switch is located on a second drive line connecting the second current control switch and the second micro-LED, and
the third period control switch is located on a third drive line connecting the third current control switch and the third micro-LED.

7. The display device according to claim 5, wherein
the first micro-LED, the second micro-LED, and the third micro-LED have different and increasing levels of luminous efficiency in an order of the first micro-LED, the second micro-LED, and the third micro-LED, and
the emission controller controls the first micro-LED, the second micro-LED, and the third micro-LED to satisfy $S1>S2>S3$, where $S1$ is an integral of a drive current supplied to the first micro-LED during the emission period of the first micro-LED, $S2$ is an integral of a drive current supplied to the second micro-LED during the emission period of the second micro-LED, and $S3$ is an integral of a drive current supplied to the third micro-LED during emission period of the third micro-LED.

8. The display device according to claim 5, wherein
the substrate comprises a mount surface on which the first pixel unit, the second pixel unit, and the third pixel unit are located, an opposite surface opposite to the mount surface, and a side surface; and
wherein the side surface receives side wiring, the opposite surface receives a driver, and
the first micro-LED, the second micro-LED, and the third micro-LED are connected to the driver with the side wiring.

* * * * *